United States Patent [19]

Mallinson

[11] Patent Number: 4,825,262
[45] Date of Patent: Apr. 25, 1989

[54] FABRY-PEROT INTERFEROMETER

[75] Inventor: Stephen R. Mallinson, Ipswich, England

[73] Assignee: British Telecommunications public limited company, England

[21] Appl. No.: 80,468

[22] PCT Filed: Oct. 16, 1986

[86] PCT No.: PCT/GB86/00631
§ 371 Date: Jun. 11, 1987
§ 102(e) Date: Jun. 11, 1987

[87] PCT Pub. No.: WO87/02470
PCT Pub. Date: Apr. 23, 1987

[30] Foreign Application Priority Data

Oct. 16, 1985 [GB] United Kingdom ............... 8525458
Oct. 16, 1985 [GB] United Kingdom ............... 8525459
Oct. 16, 1985 [GB] United Kingdom ............... 8525460
Oct. 16, 1985 [GB] United Kingdom ............... 8525461
Oct. 16, 1985 [GB] United Kingdom ............... 8525462
Oct. 23, 1985 [GB] United Kingdom ............... 8526189

[51] Int. Cl.$^4$ .................................. G01B 9/02
[52] U.S. Cl. .................................. 356/352
[58] Field of Search .......... 356/352, 345; 73/655, 73/657, 205

[56] References Cited

U.S. PATENT DOCUMENTS 3,040,583  6/1962  Post.
3,387,531  6/1968  Hesse.
3,635,562  1/1972  Catherin ............................ 356/352
4,668,093  5/1987  Cahill ................................ 356/345

FOREIGN PATENT DOCUMENTS 2242438  3/1974  Fed. Rep. of Germany ...... 356/352

OTHER PUBLICATIONS

Patents Abstracts of Japan, vol. 4, No. 146 (P-31) (628), 15th Oct. 1980, & JP, A. 5596903 (Mitsubishi Denki K.K.), 23 Jul. 1980.
Optical Engineering, vol. 20, No. 6, Nov./Dec. 1981 (Society of Photo-Optical Instrumentation Engineers, Bellingham, Washington, U.S.), P. D. Atherton et al.: "Tunable Fabry-Perot filters", pp. 806-814.
Optical Engineering, vol. 15, No. 1, Jan./Feb. 1976 (Society of Photo-Optical Instrumentation Engineers, Palos Verdes, U.S.), E. G. Lierke: "Infrared Modulator for Optical Sensors Based on a Vibrating Fabry-Perot Interferometer", pp. 35-38.
IEE Journal of Quantum Electronics, vol. QE-17, No. 12, Dec. 1981 (IEEE, New York, U.S.), H. J. Eichler et al: "Optical Tuning of a Silicon Fabry-Perot Interferometer by a Pulsed 1.06um Laser", pp. 2351-2355.

Primary Examiner—Davis L. Willis
Assistant Examiner—Matthew W. Koren
Attorney, Agent, or Firm—Nixon & Vanderhye

[57] ABSTRACT

A Fabry-Perot interferometer comprises a single crystal silicon substrate (1) with an integrally formed diaphragm (6) supported between walls (2-5). A glass superstrate (14) is mounted adjacent the substrate (1) with a spacer (13) sandwiched therebetween. Facing surfaces (12, 16) of the diaphragm (6) and superstrate (14) are polished and suitably coated to define reflective surfaces and the position of the diaphragm may be altered to vary the response of the interferometer.

15 Claims, 2 Drawing Sheets

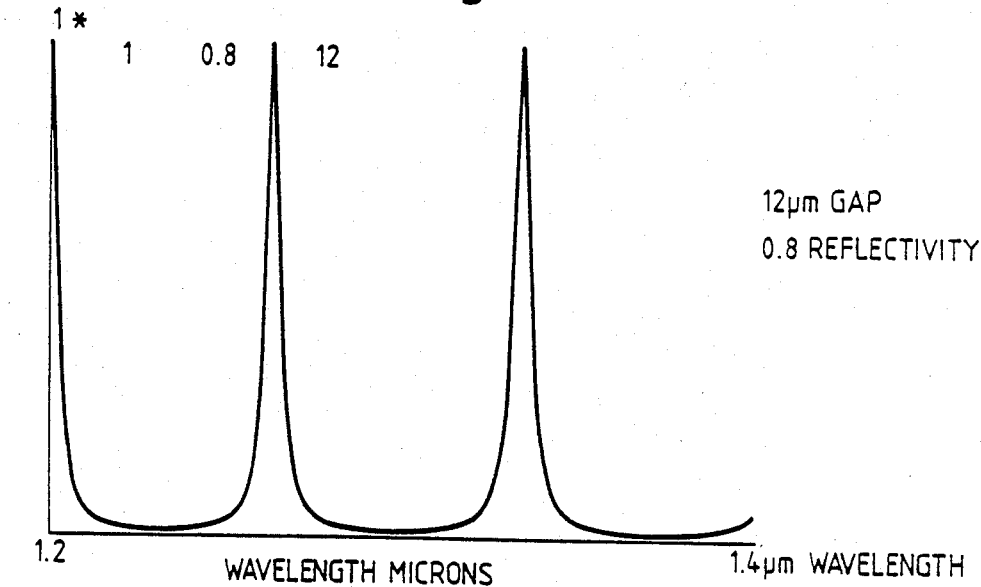
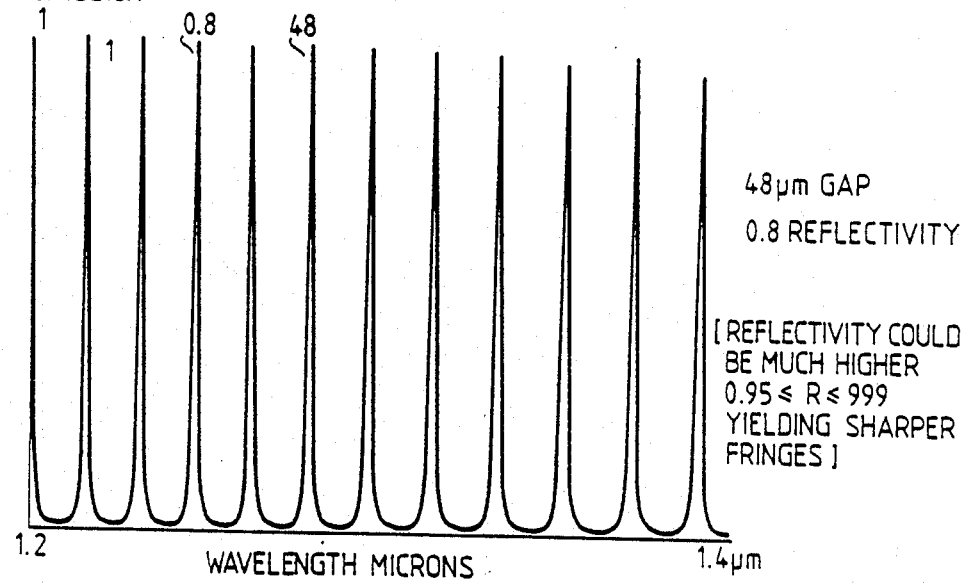

FABRY-PEROT INTERFEROMETER

The invention relates to Fabry-Perot interferometers.

A typical Fabry-Perot interferometer comprises a pair of substantially parallel reflective surfaces which are spaced apart to define a gap, at least one of the surfaces being movable relatively to the other to vary the size of the gap. In use, radiation comprising a number of different wavelengths impinges on the interferometer and passes into the gap and is then reflected between the two reflective surfaces. Constructive and destructive interference takes place leading to certain well defined wavelengths being transmitted through the interferometer while the remaining wavelengths are not transmitted. In typical Fabry-Perot interferometers a series of well defined transmission peaks are obtained corresponding to wavelengths which are transmitted, the wavelengths at which the peaks are situated being adjustable by varying the width of the gap.

Fabry-Perot interferometers have been used to a large extent to define laser cavities but also find widespread use as multiple wavelength filters.

It is important that the reflective surfaces of the interferometer are as parallel as possible and it is also desirable to be able to change the separation between the reflective surfaces over a wide range.

The most common form of Fabry-Perot interferometer currently in use comprises two glass flats securely mounted on a stable support with facing surfaces of the flats being highly polished and having suitable coatings to define the reflective surfaces. The size of the gap may vary between one millimeter and several centimeters and is varied by using microadjusters and/or piezoelectric translation elements. This is a cumbersome and expensive arrangement and has a relatively large overall size, typically in the order of inches.

Another form of Fabry-Perot interferometer comprises a single solid glass flat, the opposite faces of which are polished and suitably coated to define the reflective surfaces. The only practical way in which the spacing or gap between the surfaces can be changed is by heating the flat to cause thermal expansion. This construction suffers from the disadvantage that the variation in separation obtainable is small and the disadvantage that it is very difficult to obtain accurately parallel surfaces.

In accordance with the present invention, in a Fabry-Perot interferometer one of the reflective surfaces is provided on a diaphragm mounted by a hinge assembly to a support.

This invention improves upon the known interferometers by making use of a diaphragm to provide one of the reflective surfaces and mounting the diaphragm by a hinge assembly to a support so that the position of the diaphragm can be easily changed. This enables the size of the gap to be easily and rapidly changed. For example, the interferometer can be used to demultiplex an incoming wavelength division multiplexed signal in which a number of different channels are carried by different wavelength signals. In this application, it is often necessary to retune rapidly from one channel to another and this can easily be achieved using an interferometer according to the invention.

Preferably, the diaphragm and the hinge assembly are integral with the support. This leads to a compact and secure construction which is much cheaper to manufacture than known devices and involves far fewer components.

Conveniently, a single crystal such as silicon is used for the support, diaphragm and hinge assembly. This is particularly advantageous since conventional micromachining techniques such as anisotropic etching can be used to form the hinge assembly and diaphragm. Such techniques include masking and etching and laser etching. (It is also believed that these techniques will enable the orientation of the reflective surfaces to be accurately controlled thus making it easier to arrange the one reflective surface parallel with the other.)

The interferometer may further comprise control means responsive to control signals to cause the diaphragm to move relatively to the support towards and away from the other reflective surface. The control means may comprise a pair of electrodes for connection in to a control circuit for generating an electrostatic field wherein the position of the diaphragm corresponds to the strength of the field.

The interferometer could be used as a pressure sensor due to the sensitive mounting arrangement of the diaphragm. For example pressure changes due to acoustic fields would cause the diaphragm to oscillate thus modulating a single wavelength incident optical wave. This would find application in microphones and hydrophones.

Typically, the other reflective surface may be provided on a facing surface of a superstrate positioned adjacent the substrate. The superstrate may conveniently be formed of glass.

Preferably, the superstrate and substrate are connected together via an intermediate spacer layer since this will form a compact construction.

As has previously been mentioned, the interferometer may be used to demultiplex a wavelength division multiplexed signal or to define a laser cavity. In the latter case, a suitable gain medium would be positioned between the reflective surfaces.

Another application for which interferometers according to the invention are particularly applicable is in the construction of an optical beam modulator. The use of a diaphragm enables the size of the separation of the reflective surfaces to be rapidly changed, for example at kilohertz rates. If a single wavelength beam is incident on the interferometer, this can be modulated by moving the diaphragm between two positions at one of which the beam is transmitted and at the other of which the beam is not transmitted.

In another application, the interferometer can be used as a wavelength switch when beams of radiation centered on two different wavelengths are incident on the interferometer. By suitably choosing the size of the gap, it can be arranged that one wavelength is transmitted while the other is back reflected.

An example of a Fabry-Perot interferometer according to the invention will now be described with reference to the accompanying drawings, in which:

FIGS. 3 and 4 illustrate the performance of the interferometer with two different gaps.

Figure 1:
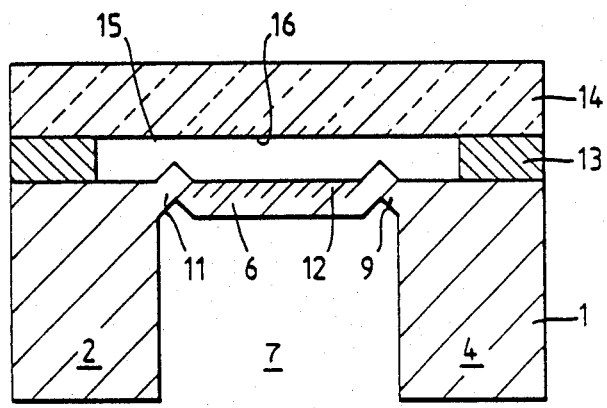
FIG. 1 is a cross-section.
Figure 2:
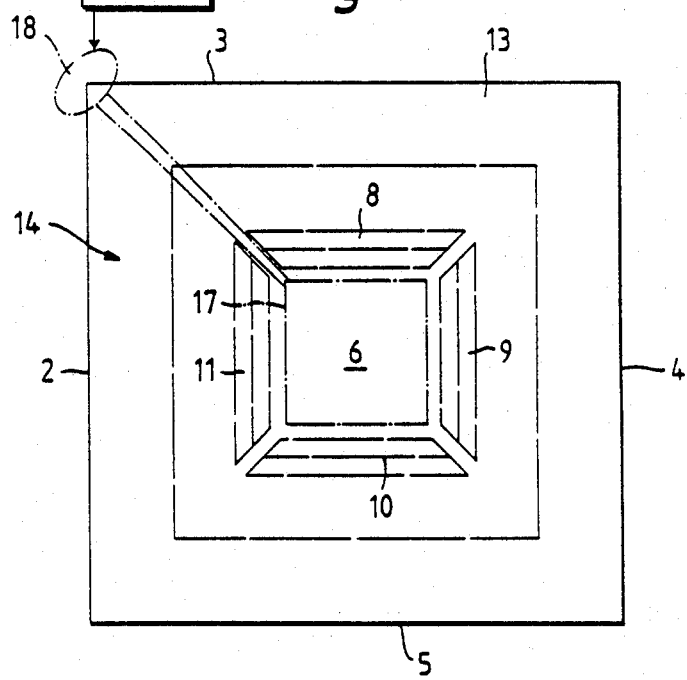
FIG. 2 is a plan.

The interferometer shown in FIGS. 1 and 2 comprises a single crystal silicon substrate 1 having four integral walls 2-5 forming a square. A diaphragm 6 is suspended from upper portions of the walls 2-5 within a central aperture 7 by a hinge assembly comprising four bridges 8-11 each having a typical length in the range 1–5 mm. The hinge assembly is integral with both the substrate 1 and the diaphragm 6. This structure is formed by anisotropically etching the substrate 1. A semi-reflective coating 12 is provided on a polished upper surface of the diaphragm 6.

A spacer layer 13 having a typical thickness in the range 5–50 μm is grown around the perimeter of the substrate 1 and a glass superstrate 14 is bonded to the spacer layer 13. An air gap 15 is defined between the superstrate 14 and the substrate 1. A portion 16 of the surface of the superstrate 14 facing the diaphragm 6 is polished and coated with a reflective coating to define a second reflective surface.

A pair of transparent electrodes are coated on the surfaces 6, 16 and are connected to a control circuit responsive to control signals to cause the diaphragm to move relatively to the support towards and away from the other reflective surface. Suitable electrodes may be made from Indium Tin Oxide. One electrode is indicated at 17 coupled with a contact pad 18. In a modification (not shown) one electrode could be on the surface of the diaphragm opposite the surface 6.

In use, a beam of radiation impinges on either the glass superstrate 14 or the underside of the diaphragm 6 and passes into the air gap 15. Internal reflection of the beam takes place in the air gap 15 due to the reflective surfaces 12, 16 resulting in constructive and destructive interference of the different wavelengths in the incoming beam. The result of this is that certain beams of very narrow bandwidth are transmitted through the air gap into the opposing substrate or superstrate while the majority of the wavelengths are back reflected.

The size of the air gap 15 (i.e. the distance between the reflective surfaces 12, 16) can be adjusted by varying the electrostatic field generated between the electrodes. This causes movement of the diaphragm 6 relatively to the remainder of the substrate 1. A change in the size of the air gap causes a change in the wavelengths which are transmitted.

The use of a single crystal as the substrate is particularly advantageous, as previously mentioned, since the walls 2–4, diaphragm 6, and bridges 8–11 can be integrally formed by conventional micromachining techniques. This leads to a very cheap product compared with previous interferometers and also enables small air gaps to be defined. It should be noted that the interferometer would need no adjustment or setting up since the cavity gap would be defined during manufacture.

If desired, the size of the gap can be monitored by providing capacitor plates on the facing surfaces of the superstrate 14 and the bridge 6 and monitoring the capacitance between the plates. This could very simply be achieved by making use of the electrodes as capacitor plates while a voltage is applied between them.

Furthermore, due to their small size, a number of Fabry-Perot interferometers could be fabricated onto a single wafer which would be particularly useful in optical communication fields.

FIGS. 3 and 4 illustrate graphically examples of the transmission characteristics of the interferometer with gaps of 12 μm and 48 μm respectively. In each case the reflectivity of the facing surfaces is 0.8 although it could be as high as 0.999.

The device may find application, inter alia, as wavelength selective element in long external cavity lasers.

I claim:

1. A Fabry-Perot interferometer having two reflective surfaces in which one of the reflective surfaces is provided on a diaphragm mounted by a hinge assembly to a support wherein the diaphragm and the hinge assembly are integral with the support, and the support, diaphragm and hinge assembly are made form a single crystal.

2. An interferometer according to claim 1, wherein the crystal is silicon.

3. An interferometer according to claim 1, further comprising control means responsive to control signals to cause the diaphragm to move relatively to the support towards and away from the other reflective surface.

4. An interferometer according to claim 3, wherein the control means comprises a pair of electrodes for connection in a control circuit for generating an electrostatic field.

5. An interferometer according to claim 1 or 2 wherein the other reflective surface is formed on a superstrate adjacent a substrate on which said diaphragm is formed.

6. An interferometer according to claim 5, wherein a spacer is positioned between the substrate and superstrate.

7. An interferometer according to claim 5, wherein the superstrate comprises glass.

8. A method of modulating a beam of radiation, the method comprising causing the beam to impinge on a Fabry-Perot interferometer according to claims 1 or 2 and causing the diaphragm to oscillate between two positions in response to control signals, whereby in one position the beam is transmitted through the interferometer while in the other position the beam is not transmitted.

9. An interferometer according to claim 2 wherein the hinge assembly comprises four bridges defining an aperture of substantially square cross section within which the diaphragm is suspended.

10. An interferometer according to claim 5 further comprising control means responsive to control signals to cause the diaphragm to move relatively to the support towards and away from the other reflective surface.

11. A Fabry-Perot interferometer comprising:
a first partially reflective member;
a second partially reflective member disposed parallel to the first member and adjustably disposed with respect thereto so as to permit variable dimensioning of an optical Fabry-Perot interferometer cavity formed therebetween; and
an at least partially transparent electrode means disposed on each of said members for electrostatically controlling said variable dimensioning as a function of an electrical signal impressed across said electrode means.

12. An interferometer as in claim 11 wherein said second partially reflective member comprises a single crystal substrate having:
a reflective diaphragm integrally and hingedly connected within a central aperture to outer surrounding walls.

13. An interferometer as in claim 12 wherein said first partially reflective member comprises:
a superstrate bonded to said walls and located opposite said diaphragm.

14. An interferometer as in claim 13 wherein said superstrate is bonded to said walls via an intermediately located spacer.

15. An interferometer as in claim 11 further comprising an electrical contact pad electrically connected to each of said electrodes and also electrically connected to control said variable dimensioning in response to provided control signals.

* * * * *